US010290526B2

(12) United States Patent
Hofmann et al.

(10) Patent No.: US 10,290,526 B2
(45) Date of Patent: May 14, 2019

(54) DEVICE AND METHOD FOR ALIGNING AND HOLDING A PLURALITY OF SINGULATED SEMICONDUCTOR COMPONENTS IN RECEIVING POCKETS OF A TERMINAL CARRIER

(71) Applicant: Multitest Elektronische Systeme GmbH, Rosenheim (DE)

(72) Inventors: Thomas Hofmann, Stephanskirchen (DE); Max Schaule, Mindelheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 142 days.

(21) Appl. No.: 14/326,390

(22) Filed: Jul. 8, 2014

(65) Prior Publication Data

US 2014/0327202 A1 Nov. 6, 2014

Related U.S. Application Data

(63) Continuation of application No. 13/950,156, filed on Jul. 24, 2013, now Pat. No. 8,794,613, which is a
(Continued)

(30) Foreign Application Priority Data

Feb. 15, 2008 (DE) .................. 10 2008 009 500

(51) Int. Cl.
*G01R 1/04* (2006.01)
*G01R 31/28* (2006.01)
*H01L 21/673* (2006.01)

(52) U.S. Cl.
CPC .......... *H01L 21/673* (2013.01); *G01R 1/0425* (2013.01); *G01R 31/2893* (2013.01);
(Continued)

(58) Field of Classification Search
CPC ... H05K 7/00; B23Q 7/00; B23Q 3/00; H01L 21/687; H01L 21/673; H01L 21/67333; H01L 21/6734; C25D 17/06; C25D 17/08
(Continued)

(56) References Cited

U.S. PATENT DOCUMENTS 3,738,639 A 6/1973 Berlyn
4,255,077 A 3/1981 Smith
(Continued)

FOREIGN PATENT DOCUMENTS

GB 2443659 A * 5/2008 ....... H01L 21/67333
JP 04-039949 2/1992
(Continued)

OTHER PUBLICATIONS

Notification; English Translation of International Preliminary Report on Patentability; and Written Opinion of the International Searching Authority, for International Application No. PCT/EP2009/000994, 8 pages.
(Continued)

*Primary Examiner* — Tyrone V Hall, Jr.
(74) *Attorney, Agent, or Firm* — Lewis Roca Rothgerber Christie LLP

(57) ABSTRACT

In a device and a method for aligning and holding a plurality of singulated semi-conductor components in receiving pockets of a terminal carrier that are separated from each other, the terminal carrier has spring elements, which are part of a spring plate. The spring plate has a plurality of recesses disposed next to each other for forming a corresponding plurality of receiving pockets for the semi-conductor components, wherein the spring elements are formed from the spring plate in one piece.

14 Claims, 13 Drawing Sheets

Related U.S. Application Data continuation of application No. 12/665,531, filed as application No. PCT/EP2009/000994 on Feb. 12, 2009, now abandoned.

(52) U.S. Cl.
 CPC .. *H01L 21/67333* (2013.01); *H01L 2221/683* (2013.01); *Y10T 29/41* (2015.01)

(58) Field of Classification Search
 USPC ............ 269/56, 254 CS, 111, 317, 319, 305;
 29/559, 464, 759; 324/750.05; 206/701;
 248/346.04; 414/774
 See application file for complete search history.

(56) References Cited

U.S. PATENT DOCUMENTS

| | | | |
|---|---|---|---|
| 4,782,589 A | 11/1988 | Dennis | |
| 4,886,169 A | 12/1989 | Ayers et al. | |
| 4,971,676 A | 11/1990 | Doue et al. | |
| 5,085,362 A * | 2/1992 | Art | H01L 21/67126 228/122.1 |
| 5,176,255 A | 1/1993 | Seidler | |
| 5,215,472 A * | 6/1993 | DelPrete | G01R 1/0483 439/331 |
| 5,307,929 A | 5/1994 | Seidler | |
| 5,420,758 A | 5/1995 | Liang | |
| 5,501,436 A | 3/1996 | Miller | |
| 5,596,229 A | 1/1997 | Simon | |
| 5,758,776 A * | 6/1998 | Slocum | H05K 13/0084 206/714 |
| 5,785,307 A * | 7/1998 | Chung | H05K 13/0069 269/254 CS |
| 5,957,293 A * | 9/1999 | Pakeriasamy | H01L 21/67333 206/565 |
| 6,058,676 A * | 5/2000 | Abraham | B25B 11/005 53/287 |
| 6,082,547 A * | 7/2000 | Nentl | H01L 21/67333 206/560 |
| 6,474,477 B1 * | 11/2002 | Chang | H01L 21/67333 206/509 |
| 6,553,644 B2 | 4/2003 | Karmaniolas et al. | |
| 6,627,483 B2 * | 9/2003 | Ondricek | G01R 1/0408 257/678 |
| 6,743,296 B2 | 6/2004 | Kao | |
| 7,156,680 B2 | 1/2007 | Saito | |
| 7,172,184 B2 * | 2/2007 | Pavani | C25D 17/08 204/297.06 |
| 7,258,703 B2 | 8/2007 | Cheng et al. | |
| 7,410,363 B1 | 8/2008 | Gattuso et al. | |
| 7,916,499 B2 | 3/2011 | Feng et al. | |
| 8,676,370 B2 * | 3/2014 | Lambert | H05K 13/021 198/867.12 |
| 2002/0158396 A1 * | 10/2002 | Bennett | H05K 13/021 269/309 |
| 2003/0017629 A1 | 1/2003 | Tsui et al. | |
| 2004/0108641 A1 | 6/2004 | Reese et al. | |
| 2005/0072714 A1 * | 4/2005 | Eleveld | H01L 21/67333 206/701 |
| 2005/0072715 A1 | 4/2005 | Pylant et al. | |
| 2005/0186122 A1 * | 8/2005 | Mercer | B01L 9/52 422/400 |
| 2005/0258068 A1 * | 11/2005 | Chien | A45C 11/18 206/701 |
| 2006/0154386 A1 * | 7/2006 | Cheng | G01R 1/045 438/15 |
| 2007/0285106 A1 | 12/2007 | Henry et al. | |
| 2011/0006183 A1 | 1/2011 | Hofmann et al. | |

FOREIGN PATENT DOCUMENTS

| | | |
|---|---|---|
| JP | 07-098361 | 4/1995 |
| JP | 09-329643 | 12/1997 |
| JP | 10-284878 A | 10/1998 |
| JP | 2006-284384 | 10/2006 |
| WO | 2004106944 A1 | 7/2006 |

OTHER PUBLICATIONS

Japanese Office action issued in corresponding Japanese Appln. No. 2010-512720, dated Jan. 24, 2012, with English Translation, 18 pages.

* cited by examiner

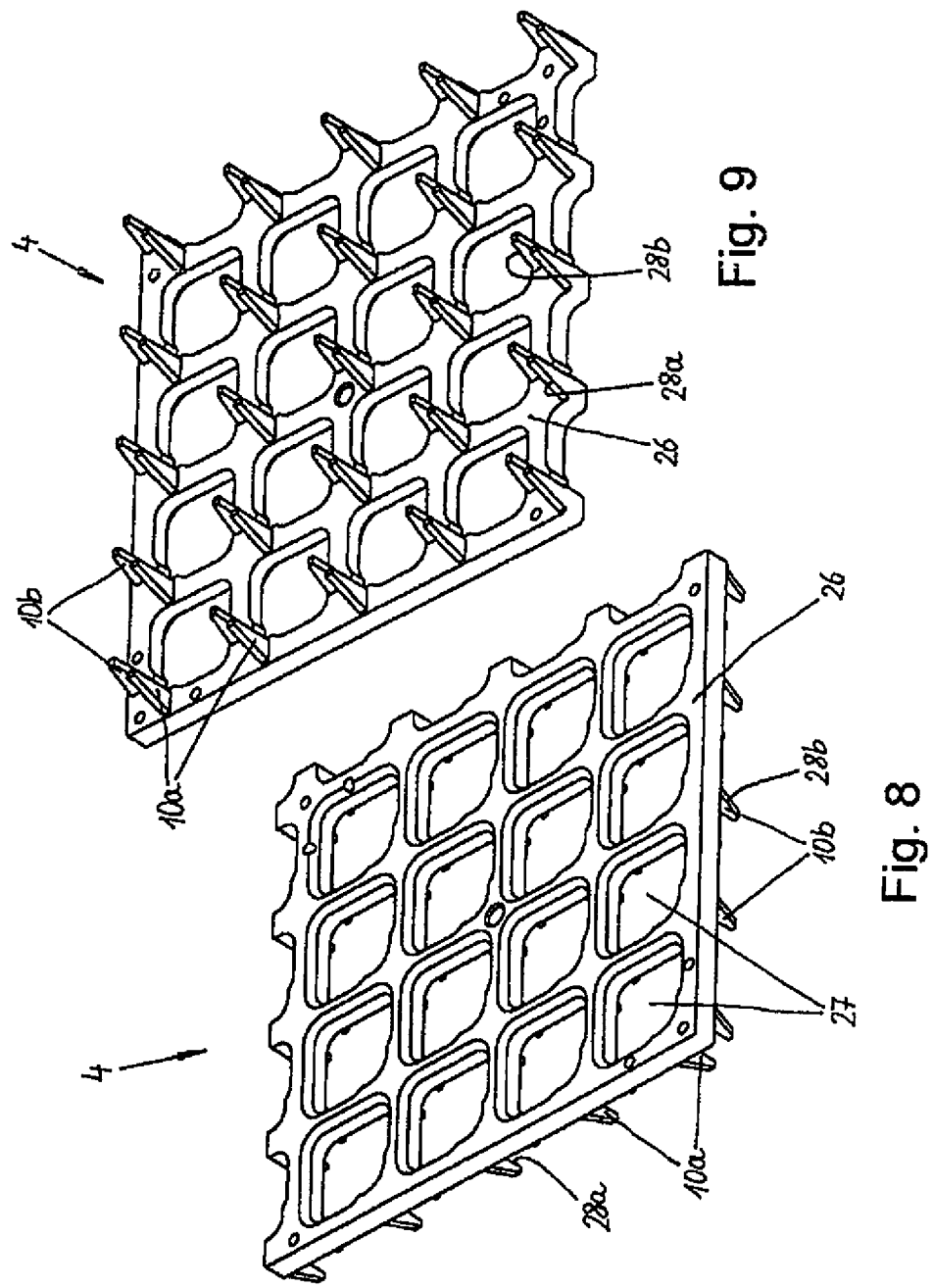

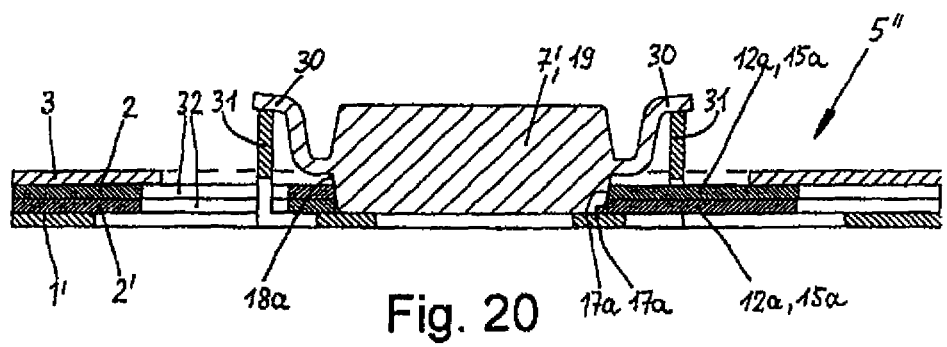
Fig. 20
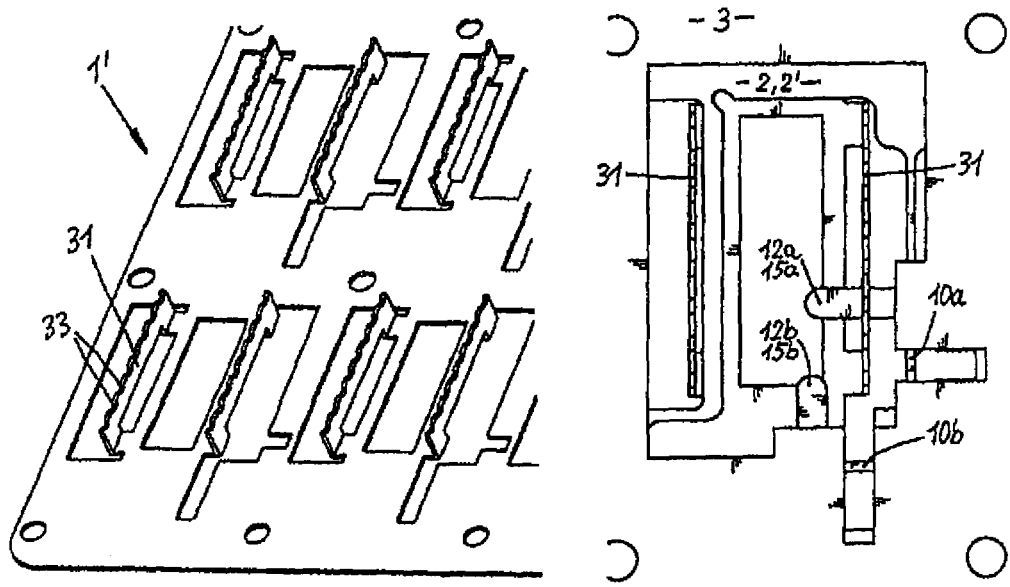
Fig. 21
Fig. 22
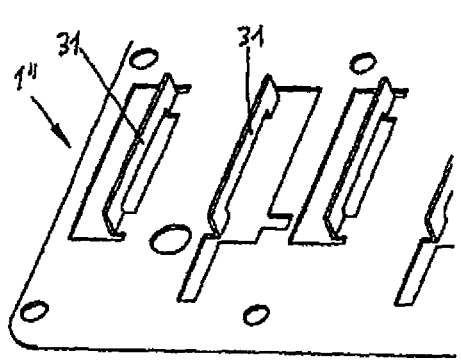
Fig. 23

DEVICE AND METHOD FOR ALIGNING AND HOLDING A PLURALITY OF SINGULATED SEMICONDUCTOR COMPONENTS IN RECEIVING POCKETS OF A TERMINAL CARRIER

CROSS-REFERENCE TO RELATED APPLICATIONS

This application is a continuation of U.S. application Ser. No. 13/950,156, filed Jul. 24, 2013, which is a continuation of U.S. application Ser. No. 12/665,531, filed Dec. 18, 2009, which is a 371 Application and claims priority to and the benefit of International Patent Application PCT/EP2009/000994, filed on Feb. 12, 2009, and which claims priority to German Patent Application No. DE 10 2008_009_500.1, filed on Feb. 15, 2008, the entire disclosures of which are incorporated herein by reference.

BACKGROUND OF THE INVENTION

The present teachings relates to a device and a method for aligning and holding a plurality of singulated semiconductor components in receiving pockets of a plate-like terminal carrier (clamping carrier).

Semiconductor components, such as, for example, BGAs (Ball Grid Arrays), MLFs, QFNs, semiconductor components with pins, etc, are usually subjected after their manufacture to electrical and/or mechanical function tests. For this purpose robotic handlers, also called handlers, are used, which at high speeds make contact between the semiconductor components and a testing device, and, after execution of the function test remove them once again from the latter in order to sort them depending on the test result. Frequently, the function test is executed under particular temperature conditions, wherein the temperature range can range from −60° C. to +160° C.

The semiconductor components to be tested are usually present as two different types, namely as singulated components, or as a strip-shaped composite ("strips"). Singulated components have no connection among one another, so that each component in a handler is usually sucked individually, or in small groups, and transported to one or a plurality of contact sockets which are electrically connected with an electronic computing unit of the testing device. In this manipulation of singulated components it is, however, necessary to centre each individual component directly in front of the contact sockets in order to ensure that the often very small and densely side-by-side arranged connecting contacts of the components accurately match up with the corresponding contacts of the contact sockets. Furthermore, already for space reasons it is mostly only possible to arrange a limited number of suction lifters side-by-side so that the number of components that can be tested simultaneously is very limited. As a result the throughput of the handler is correspondingly limited.

Semiconductor components that are present in the form of a strip are usually tested in that the strip is inserted into a so-called nest which is docked to a testing head. Since the position of the individual components on the strip and the position of the strip within the nest are accurately defined, with the centering of the nest relative to the testing head it is ensured that all components are located in the correct contact location. The number of components that can be simultaneously tested if strips are present is therefore significantly greater than in the case of singulated components. This delivers advantages with regard to the handler throughput.

In order to transfer the advantages of the strip arrangement also to the testing of singulated semiconductor components, it is already of known from U.S. Pat. No. 7,258,703 B2 to accommodate singulated semiconductor components in receiving pockets, separated from one another, of a clamping carrier, to align them in the receiving pockets and to subsequently convey the complete clamping carrier to a testing head in order to make contact with the individual components. This known clamping carrier has small spring platelets in the lateral region of the receiving pockets that press the components in only one direction (y-direction) against opposing stop faces. In order to align the components also in the x-direction, there must be displaced a sliding block of complex construction, which forms the bottom of the receiving pockets and has for each receiving pocket a suction head with which the components are secured by suction within the receiving pocket. This known device is of complicated construction and requires a lot of space. For these reasons this known clamping carrier is not suitable for a larger number of components, and not for very small components.

SUMMARY OF THE INVENTION

Beneficially, according to a representative embodiment, a device is constructed in a particularly simple, space-saving and cost-effective manner, and is suitable for the accommodation of a large number of semiconductor components, and also ensures that the semiconductor components are accurately aligned and securely held in the receiving pockets. Furthermore an improved method in comparison to the prior art is to be created.

In the device in accordance with the present teachings the spring elements are part of a spring plate, which has a plurality of recesses disposed side-by-side to form a corresponding plurality of receiving pockets for the semiconductor components, wherein the spring elements are formed from the spring plate in one piece.

In comparison to known clamping carriers, the clamping carrier ("Klemmvorrichtung") according to the present teachings can be designed simpler, very space-saving and more cost-effective. Of particular advantage is that the clamping carrier according to the present teachings is also suitable for the accommodation of a large number of semiconductor components which can be aligned quickly and very accurately within the receiving pockets so that they assume an accurately defined position. Furthermore the spring elements serve for not only the alignment, but also for clamping of the semiconductor components within the associated receiving pockets in the accurately aligned position, so that other securing means, for example in the form of suction heads, can be dispensed with. The whole clamping carrier can in particular be designed as a thin plate, on which the singulated semiconductor elements can be securely held in the form of a matrix in an accurately defined position and alignment. Hence the semiconductor components although being singulated elements, can be tested in handlers that are constructed in an identical or similar manner to handlers that are used for the testing of strips.

In accordance with an advantageous embodiment the spring plate consists of a flat plate and the spring elements of spring tongues that are arranged and can be moved in the plane of the spring plate, or parallel to this plane. Thereby the spring plate can have a very small height of, for example, only 0.1 to 1 mm.

In accordance with an advantageous embodiment, the clamping carrier consists of a multi-layer plate combination ("Verbundplatte") that comprises the spring plate, and, adjacent to the spring plate, a base plate and/or cover plate, wherein the spring plate extends at least over the major part of the base plate or cover plate. Here, the base plate and/or cover plate can have various functions, for example they can stabilize the spring elements at right-angles to the main plane of the spring plates, can carry stop elements for the semiconductor components, or can have centering means for an actuation device for the spring elements. Hereby it is possible in a particularly effective manner to reduce the height of construction of the clamping carrier such that the whole clamping carrier has the form of a thin plate whose height can be less than 1 mm. Depending on the application it is, however, also possible to embody the spring plate and/or cover plate in a significantly thicker manner, for example in order to increase the depth of the receiving pockets.

If a base plate is present, it is advantageous if the base plate is designed as a flat plate that forms the bottom of the receiving pockets.

In accordance with an advantageous embodiment the clamping carrier has per receiving pocket at least two spring elements arranged at an angle to one another with spring forces of different strengths, by means of which the semiconductor components are pressable in two different directions against the stop elements, wherein the spring elements interact with the actuation device such that the spring element with the weaker spring force firstly presses the semiconductor component against the opposing stop element respectively assigned and the spring element with the stronger spring force only subsequently presses the semiconductor component against the opposing stop element respectively assigned. Thereby, since at first the spring element with the weaker spring force presses the semiconductor component against the opposing, first stop element, it is ensured in a simple manner that also the spring element with the stronger spring force can displace the component in the direction toward the opposing second stop element, without the component becoming clamped in an intermediate position. The spring force of the stronger spring element is thus dimensioned such that it can overcome the holding forces generated by the weaker spring element.

In accordance with an advantageous embodiment the spring plate per receiving pocket has a floatingly attached spring plate section that is provided with centering means and has at least one spring element as well as the recess for introducing the semiconductor component. Thereby it is possible to centre the floatingly attached spring plate section, and therewith the semiconductor element in a very accurate and smooth-running manner, for example relative to a contact socket or a DUT board if the clamping carrier is driven into the contact position.

In accordance with an advantageous embodiment, between the base plate and the spring plate and/or between the spring plate and the cover plate spacers are arranged which hold the spring plate at a distance from the base plate or cover plate, respectively. Thereby it can be effected that the spring elements can move with significantly reduced friction losses, or totally without friction losses, between the base plate and the cover plate, so that the components are always pressed with accurately defined pressing forces by the spring elements against the opposing stop elements.

The stop elements for accurate positioning of the semiconductor components can be arranged either at the cover plate or directly on the spring plate. Advantageously the stop elements consist of two adjacent, perpendicularly to each other arranged side faces of the cover plate or spring plate, which border the receiving pockets.

In accordance with an advantageous embodiment the clamping carrier is designed for the accommodation of semiconductor components having pins, wherein the base plate has pin section elements, which extend through the recesses of the spring plate so as to form a support for the pins. Pin section elements of this kind, which are also called 'lead backers', support the pins when contact is made with the contact elements of the testing head, such that the pins cannot be bent aside.

In accordance with an advantageous embodiment the pin section elements consist of plate sections, which are formed from the base plate in one piece and are angled at right-angles to the plane of the base plate. Thereby it is not necessary to mount the pin section elements subsequently on one of the plates.

As an alternative hereto it is also possible to manufacture the cover plate from an electrically insulating material, wherein the cover plate has pin support sections arranged alongside the recesses, which sections form a support for the pins. Thereby it is possible to manufacture the support for the pins in a very simple manner. In particular it is not necessary to guide pin section elements formed on the base plate through openings in the spring plate, so that a greater freedom of configuration is provided in the design of the base plate and spring plate.

In accordance with an advantageous embodiment the clamping carrier has two or a plurality of spring plates arranged one above the other, on which the spring elements are arranged. Thereby it is possible for the spring elements to match up better to inclined faces of the component body.

In accordance with an advantageous embodiment the actuation device has a main plate arranged parallel to the plane of the clamping carrier and actuators protruding from the main plate, which, as the actuation device approaches the clamping carrier, engage with the spring elements so as to press the latter laterally outward into an open position. Here it is in particular possible that the actuators consist of wedge elements with inclined faces that can be brought in and out of engagement with the spring elements. As an alternative to this it is, however, also conceivable that the actuators, after they have been brought into engagement with the spring elements, are moved laterally outwards so as to transfer the spring elements into an open position that enables the insertion of the semiconductor components into the receiving pockets.

In accordance with an advantageous embodiment the actuators of the actuation device are designed and arranged relative to the spring elements such that in a particular position of the actuation device the spring element with the stronger spring force is still in compressive engagement with the assigned actuator, whereas the spring element with the weaker spring force is already out of compressive engagement with the assigned actuator. Since here the spring element with the weaker compressive force is first released from the actuation device, it is in this manner ensured that the spring element with the weaker compressive force presses the semiconductor component onto the opposing stop element, before this operation is executed by the spring element with the stronger spring force.

Alternatively or additionally it is also possible that the spring element with the weaker spring force has a first pressure face that is bringable (can be brought) into contact with the semiconductor component, and that the spring element with the stronger spring force has a second pressure face that can be brought into contact with the semiconductor component, wherein the first pressure face has a smaller distance from the opposing stop element than the second pressure face has from the opposing stop element, so that a semiconductor component with a square body is pressed firstly by the spring element with the weaker spring force onto the opposing stop element.

The method in accordance with the a representative embodiment comprises a clamping carrier is provided that per receiving pocket has at least two spring elements, arranged at an angle to one another, with spring forces of different strengths, so as to press the semiconductor components in two different directions against the stop elements, and in that the actuation device after the insertion of the semiconductor components into the receiving pockets is released from the spring elements such that the spring element with the weaker spring force firstly presses the semiconductor component against the respectively assigned, opposing stop element, and the spring element with the stronger spring force only subsequently presses the semiconductor component against the respectively assigned, opposing stop element.

An alternative method in accordance with a representative embodiment comprises providing a clamping carrier that per receiving pocket comprises, arranged at an angle to one another, at least two spring elements with spring forces of different strengths so as to press the semiconductor components in two different directions against the stop elements, and in that after inserting the semiconductor components into the receiving pockets, the spring elements, which are arranged at an angle to one another, are displaced by means of the actuation device such that the spring element with the weaker spring force firstly presses the semiconductor component against the respectively assigned, opposing stop element, and the spring element with the stronger spring force only subsequently presses the semiconductor component against the respectively assigned, opposing stop element.

The benefits achieved with the method in accordance with representative embodiments correspond to those that have been described in conjunction with the device in accordance with the invention.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

It is shown in

FIG. 20: A cross-sectional view of a clamping carrier in accordance with a representative embodiment with a semiconductor component inserted, FIG. 21: A section of the base plate used in FIG. 20, FIG. 22: A plan view onto the clamping carrier of FIG. 20 in the region of a receiving pocket without a semiconductor component, FIG. 23: A base plate in accordance with a representative embodiment.

DETAILED DESCRIPTION OF THE DRAWINGS

Figure 1:
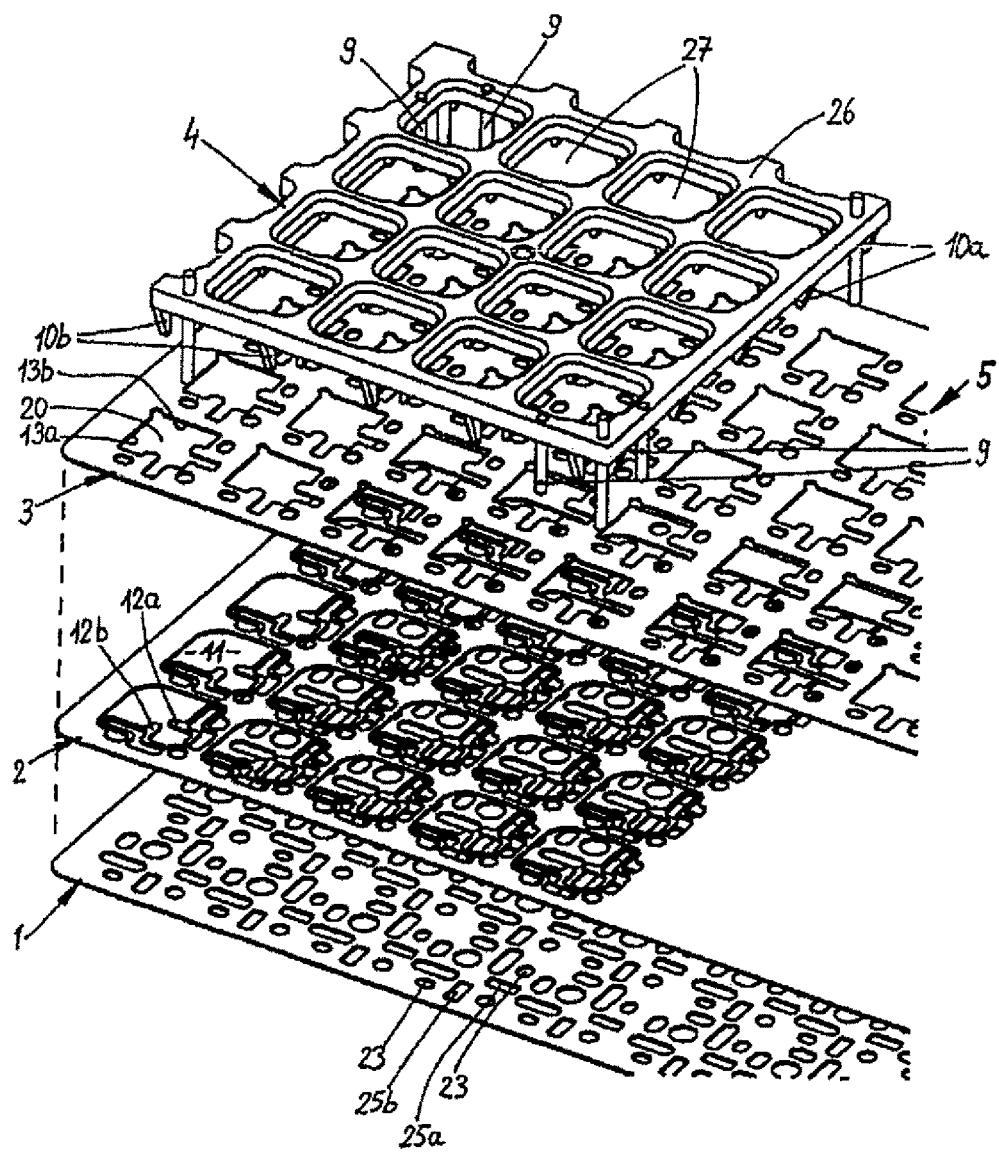
FIG. 1: An exploded view of a section of the device in accordance with a representative embodiment, with clamping carrier and actuation device.

It is to be understood that the terminology used herein is for purposes of describing particular embodiments only, and is not intended to be limiting. The terms defined below are in addition to the technical and scientific meanings of the defined terms as commonly understood and accepted in the technical field of the present teachings.

As used in the specification and appended claims, the Watts 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Figure 2:
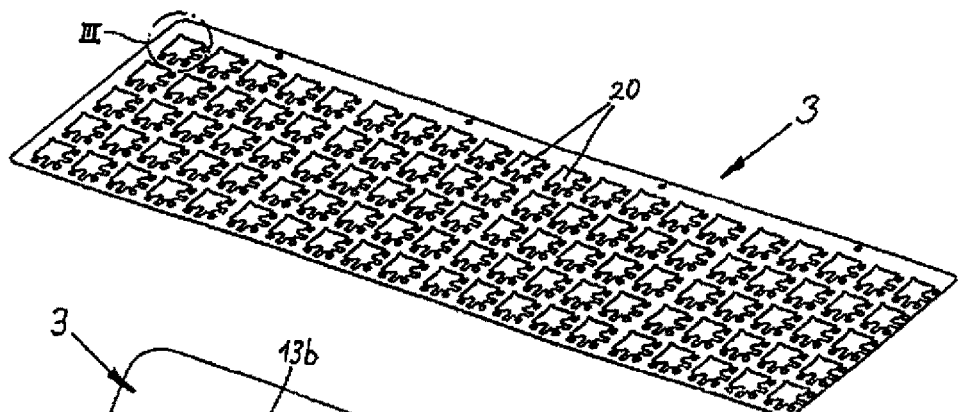
FIG. 2: An individual representation of a cover plate in accordance with a representative embodiment.
Figure 4:
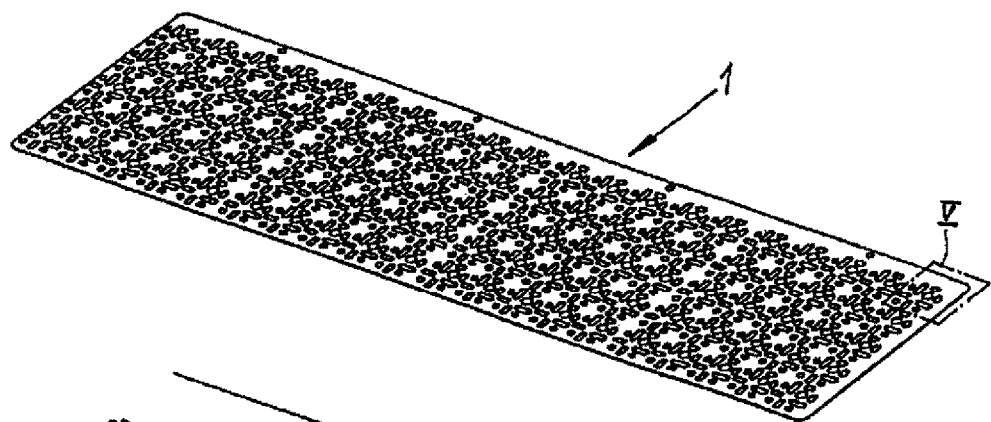
Figure 6:
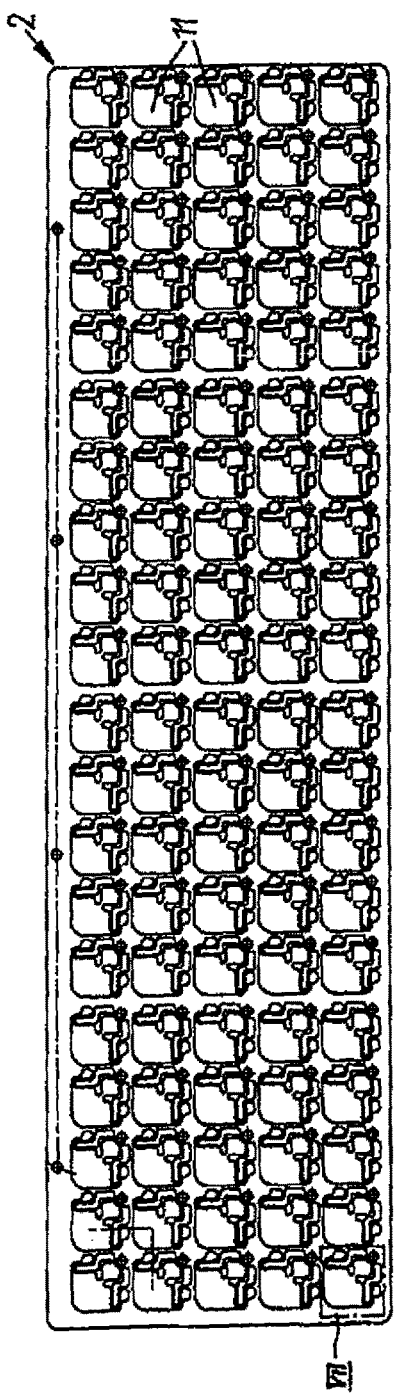

In FIG. 1 can be seen an end section of a first example of embodiment of a device in accordance with the present teachings. This device consists of a base plate 1, a spring plate 2, a cover plate 3 and an actuation device 4. Plates 1, 2, 3 each take the form of thin, plane-parallel plates, for example in the form of elongated metal strips, as they are represented in FIGS. 2, 4, 6. Plates 1, 2, 3 have the same external dimensions and are, as can be seen, for example, from FIG. 10, arranged one on top of the other, so that the result is a three-layered plate combination (composite plate). The connections of plates 1, 2, 3 among each other can, for example, take place by the use of welding, adhesive, or screws.

Figure 13:
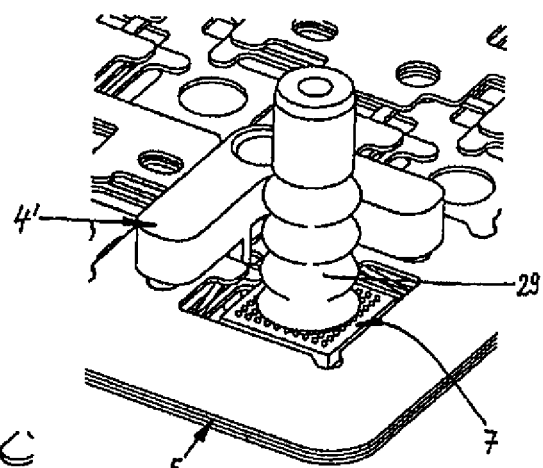
Figure 14:
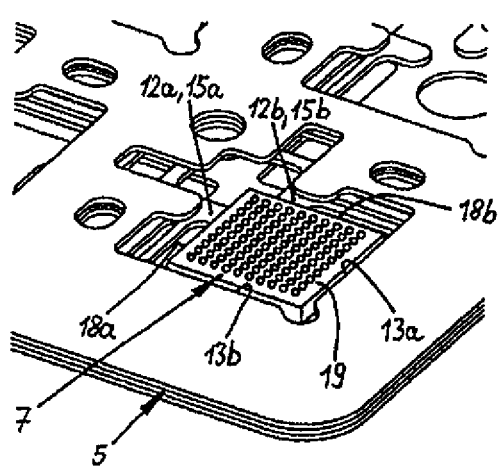
Figure 15:
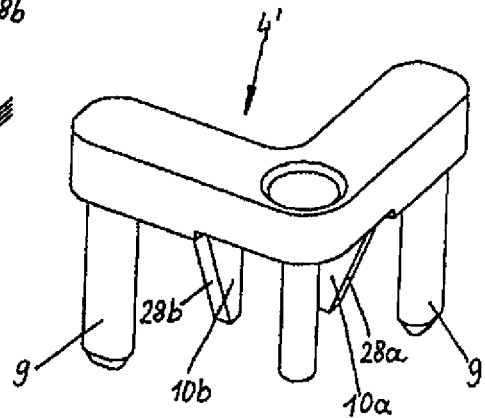
FIG. 15: An alternative embodiment of an actuation device in accordance with a representative embodiment.

Plates 1, 2, 3 together form a terminal carrier 5 (clamping carrier) with a large number of receiving pockets 6, arranged in form of a matrix, into which semiconductor components 7 can be inserted, as can be seen for example in FIGS. 13, 14.

The clamping carrier 5 shown in FIGS. 1, and 10 to 14 is conceived such that it is suitable for the accommodation of BGAs, MLFs and QFNs. The lowest layer of the clamping carrier 5 is formed by the base plate 1, which forms the bottom for the receiving pocket 6. The semiconductor components 7 inserted in the receiving pockets 6 thus rest on the base plate 1. Alternatively, however, it is also possible to attach to the base plate 1 plate-like pocket elements made, for example, of plastic, which form the bottom for the receiving pockets 6 and into which the components 7 can be inserted. As can be seen from FIGS. 4 and 5, the base plate 1 has a large number of recesses 8. In FIG. 8 can be seen a group of a total of ten recesses 8, partly elongated, partly of circular shape, wherein to each receiving pocket 6 is assigned such a group of recesses 8. The recesses 8 serve to allow centering pegs 9 and wedge-shaped actuators 10 of the actuation device 4 to pass through, as is described later in more detail.

The spring plate 2 serves to align and clamp the semiconductor components 7 in an accurately predetermined position within the receiving pockets 6. As can be seen from FIG. 6, the spring plate 2 has a large number of identical recesses 11 arranged in the form of a matrix. In the example of embodiment shown five rows of recesses 11, arranged side-by-side, are provided, wherein each row contains twenty recesses 11. The recesses 11 form the lower section of the receiving pockets 6. In the present example of embodiment the clamping carrier 5 thus has one hundred receiving pockets 6, which are arranged in a 5×20 matrix. The number and arrangement of the receiving pockets 6 can, however, vary over a wide range depending on the application.

Figure 7:
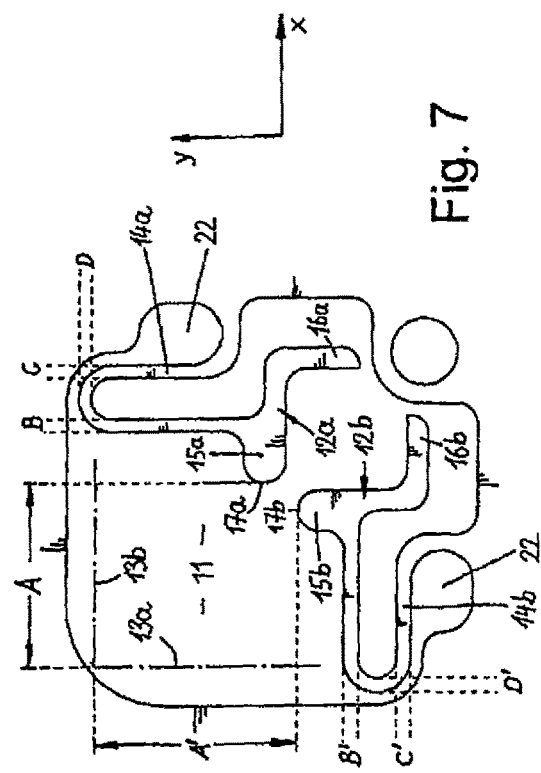
FIG. 7: An enlarged representation of the detail VII in FIG. 6, FIGS. 8 and 9: A plan view obliquely from above and below, respectively, of the actuation device in FIG. 1, FIGS. 10 to 14: Various stages when inserting a semiconductor component into a receiving pocket in accordance with a representative embodiment.

On two different sides of each recess 11 of the spring plate 2 are arranged two spring elements 12a, 12b, whose longitudinal directions run at right-angles to one another. The spring elements 12a, 12b serve to press a semiconductor component 7 inserted into the recess 11 against opposing stop elements in the form of stop faces 13a, 13b (FIG. 14), which are located on the cover plate 3 that is arranged on the spring plate 2. The location of the stop faces 13a, 13b relative to the associated recess 11 of the spring plate 2 is indicated in FIG. 7 with dot-dash lines. The stop faces 13a, 13b, arranged at right-angles to one another, serve to position the semiconductor component 7 accurately within the receiving pockets 6 relative to the cover plate 3 and thus relative to the whole clamping carrier 5, and in fact in two different directions, i.e. in both the x-direction and also the y-direction.

The spring elements 12a, 12b are designed as spring tongues and are formed out from the spring plate 2 in one piece, for example, by means of a lithographic etching method. The two spring elements 12a, 12b have a very similar form and each have a U-shaped spring section 14a, 14b, a pressure section 15a, 15b arranged at the free end of the spring section 14a, 14b, and an actuation section 16a, 16b arranged at the free end of the spring elements 12a, 12b. The pressure sections 15a, 15b have rounded pressure faces 17a, 17b, which in the x-direction and y-direction respectively project above the U-shaped spring section 14a, 14b and can be brought into contact with the adjacent side faces 18a, 18b of the body 19 of the semiconductor component 7 (FIG. 14).

The actuation section 16a, 16b represents the free end of the stirrup-shaped spring elements 12a, 12b. With the introduction of the actuators 10 of the actuation device 4 into the clamping carrier 5 the actuators 10 come into engagement with the inner face of the actuation sections 16a, 16b such that the actuation sections 16a, 16b and therewith the spring elements 12a, 12b are pressed against their spring force and increasingly laterally outwards whereby the pressure faces 17a, 17b increasingly move away from the opposing stop faces 13a, 13b and the insertion space for the semiconductor component 7 widens. If the actuators 10 are moved in turn away from the actuation sections 16a, 16b of the spring elements 12a, 12b, the spring forces of the spring elements 12a, 12b can become freely effective and can press the semiconductor component 7 against the opposing stop faces 13a, 13b.

The spring elements 12a have a smaller spring force than the spring elements 12b. This is achieved in that the widths B, C, D of the U-shaped spring section 14a are smaller than the corresponding widths B', C', D' of the U-shaped spring section 14b. Furthermore the spring elements 12a, 12b are arranged such that the separation distance A between the pressure face 17a and the opposing stop face 13a is smaller than the separation distance A' between the pressure face 17b and the opposing stop face 13b, if the spring elements 12a, 12b are located in the unloaded position. Hereby it is achieved that the spring element 12a, which has the weaker spring force, pushes the semiconductor component 7 firstly against the stop face 13a, and the spring element 12b, which has the stronger spring force, pushes the semiconductor component 7 only subsequently against the stop face 13b, if the actuators 10a, 10b of the actuation device 4 simultaneously release the actuation sections 16a, 16b of the spring elements 12a, 12b. Here the spring force of the spring element 12b is dimensioned such that it can overcome the friction force with which the weaker spring element 12a presses the semiconductor component 7 against the stop face 13a and can displace the semiconductor component 7 up to the stop face 13b, without the semiconductor component 7 becoming clamped in an intermediate position.

Instead of different separation distances A, A', or in addition to different separation distances A, A' it is also possible to arrange the actuators 10a, 10b and the actuation sections 16a, 16b relative to one another such that with the removal of the actuators 10a, 10b the actuation section 16a is released ahead of the actuation section 16b so as to align the semiconductor component 7, firstly with the weaker spring force, and only subsequently with the stronger spring force.

As already stated, in the examples of embodiment of a clamping carrier 5 shown in FIGS. 1, 10 to 14, the stop faces 13a, 13b, which serve to provide the accurate alignment of the semiconductor components 7 in the x and y directions, are located on the cover plate 3, which is arranged on the spring plate 2. As can be seen from FIGS. 2 and 3, for this purpose the cover plate 3 has recesses 20 which in number and arrangement correspond to the recesses 11 of the spring plate 2 and are arranged above the recesses 11. The stop faces 13a, 13b are a matter of adjacent side faces, arranged at right-angles to one another, of the recesses 20. All stop faces 13a, 13b are arranged in an accurately defined position on the cover plate 3 and thus are also arranged relative to one another such that the semiconductor components 7, if they are abutting against the stop faces 13a, 13b, have an accurately defined position relative to the clamping carrier 5. Also a large number of semiconductor components 7 can thus be advanced in an accurately defined position up to assigned contact elements of a testing head.

Figure 3:
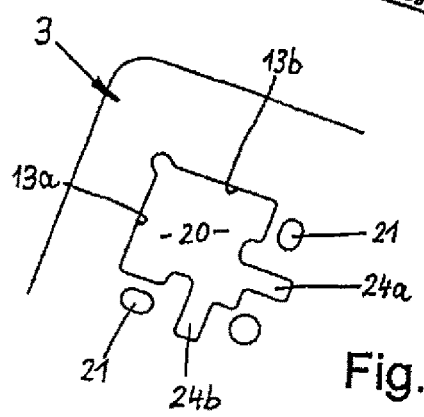
FIG. 3: An enlarged representation of the detail III in FIG. 2, FIG. 4: An individual representation of a base plate in accordance with a representative embodiment.
Figure 5:
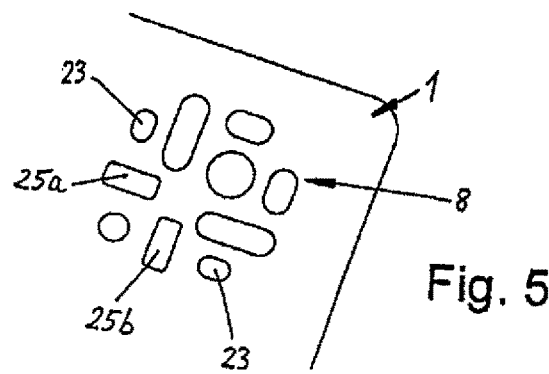
FIG. 5: An enlarged representation of the detail V in FIG. 4, FIG. 6: An individual representation of a spring plate in accordance with a representative embodiment.

From FIG. 3 furthermore centering holes 21, arranged alongside the recesses 20, are apparent through which the centering pins 9 of the actuation device 4 can be guided. These centering holes 21 are aligned with corresponding centering recesses 22 in the spring plate 2 (FIG. 7) and with corresponding centering holes 23 in the base plate 1 (FIG. 5). The centering pins 9 of the actuation device 4 can thus be guided through the whole clamping carrier 5.

Furthermore the recesses 20 of the cover plate 3, as can be seen from FIG. 3, have lateral indents 24a, 24b, which are located above the actuation sections 16a, 16b of the spring elements 12a, 12b, and furthermore are arranged above recesses 25a, 25b in the base plate 1 (FIG. 1). The actuators 10a, 10b of the actuation device 4 can therefore push through the indents 24a, 24b of the cover plate 3, through the recesses 11 of the spring plate, and through the recesses 25a, 25b of the base plate 1, wherein they achieve engagement with the actuation sections 16a, 16b of the spring elements 12a, 12b and press these laterally outwards so as to widen the insertion space for the semiconductor components 7 into the receiving pockets 6, and thereby to enable the insertion of the semiconductor components 7.

In the following, the actuation device 4 is described in more detail on the basis of FIGS. 8 and 9. The centering pins shown in FIG. 1 are not shown In FIGS. 8 and 9.

In the depicted example of embodiment, the actuation device 4 is formed as a laminar opener, which can simultaneously open a large number of, or all, receiving pockets 6 of the clamping carrier 5. Accordingly, the actuation device 4 extends over a part, or the whole, of the clamping carrier 5. In FIGS. 8 and 9 just a section of the actuation device 4 is represented, which is suitable for the opening of 25 receiving pockets 6, which are present in a 5×5 matrix.

The actuation device 4 has a main plate 26, which is arrangable parallel to the clamping carrier 5. This main plate 26 is designed as a perforated plate with centering openings 27, which are located above the receiving pockets 6. The centering openings 27 have a diameter that is slightly larger than the semiconductor components 7, such that the semiconductor components 7 on the one hand can be guided through the centering openings 27 and on the other hand, when guided through, are pre-centered relative to the receiving pockets 6.

From the main plate 26 the actuators 10a, 10b extend at right-angles downwards, wherein the actuators 10a, 10b may be designed with the main plate 26 in one piece, or may subsequently be mounted onto the latter. The actuators 10a, 10b take the form of wedge elements with inclined faces 28a, 28b. If the actuation device 4 is brought closer to the clamping carrier 5 such that the actuators 10a, 10b are introduced to an increasing extent into the recesses or indents of the clamping carrier 5, then the inclined faces 28a come into engagement with the actuation sections 16a of the spring elements 12a, while the inclined faces 28b of the actuators 10b achieve engagement with the actuation sections 16b of the spring elements 12b. By the approach of the actuation device 4 towards the clamping carrier 5 the spring elements 12a, 12b are increasingly pressed outwards, so that the semiconductor components 7 can be inserted into the receiving pockets 6. If the actuation device 4 is in turn removed from the clamping carrier 5, the spring elements 12a, 12b are released so that the semiconductor components 7 can press against the stop faces 13a, 13b, as already elucidated above.

The insertion and alignment of the semiconductor components 7 in the receiving pockets 6 is elucidated in more detail in the following on the basis of FIGS. 10 to 15, which show the same clamping carrier 5 as shown in FIG. 1, but an alternative, schematically depicted example of embodiment of an actuation device 4'. The actuation device 4' operates, however, according to the same principle as the actuation device 4, so that the following remarks apply for both embodiments.

Figure 10:
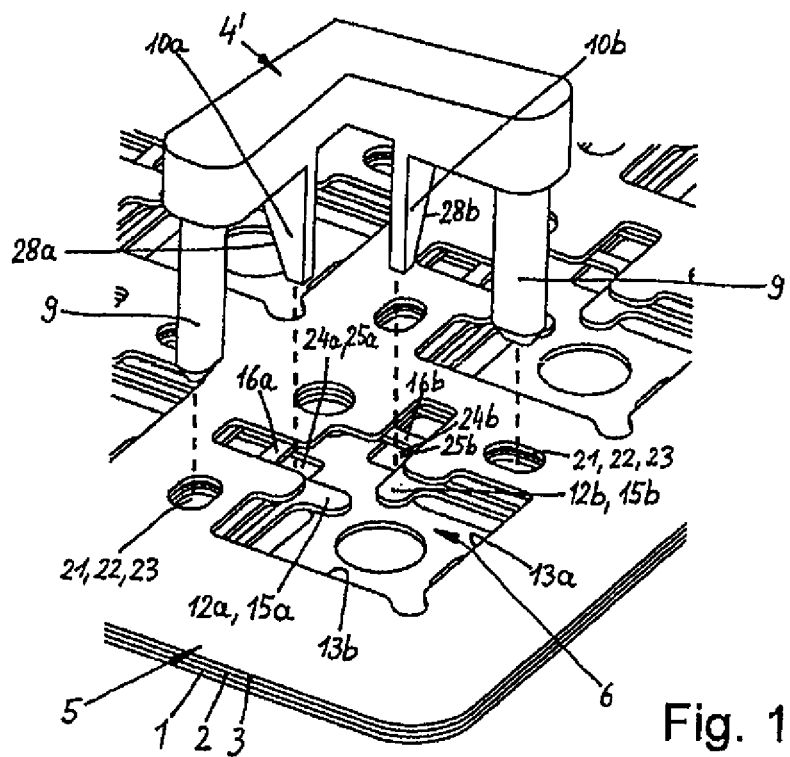

In FIG. 10, the actuation device 4' is located at a distance above the clamping carrier 5. The centering pins 9 are aligned with the centering holes and recesses 21, 22, 23, respectively, while the actuators 10a, 10b are located above the indents 24a, 24b and recesses 25a, 25b respectively. The spring elements 12a, 12b are located in their unloaded, relatively far inwardly projecting position.

Figure 11:
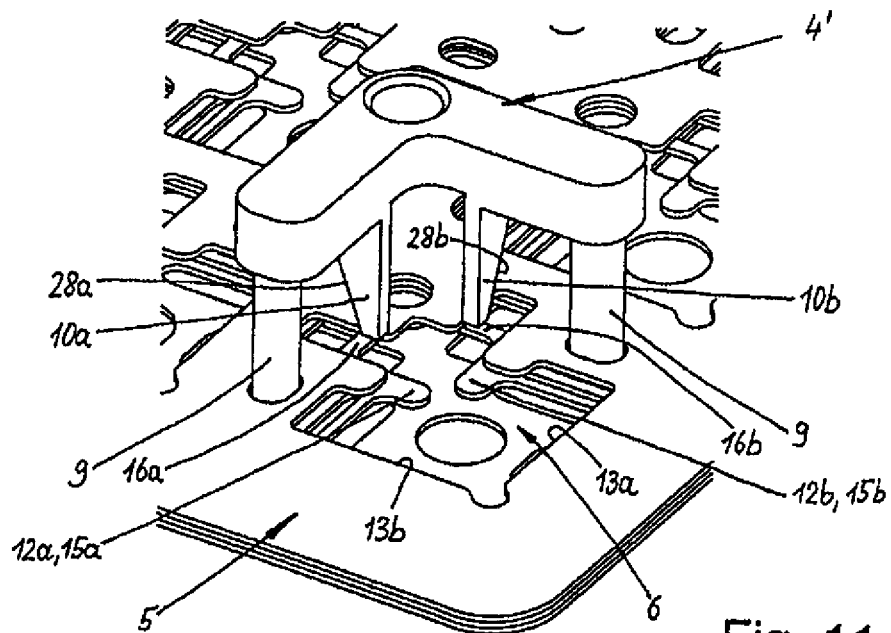

FIG. 11 shows the actuation device 4' in a lowered position, wherein the centering pins 9 are already in engagement with the clamping carrier 5, but the actuators 10*a*, 10*b* are not yet in engagement with the spring elements 12*a*, 12*b*.

Figure 12:
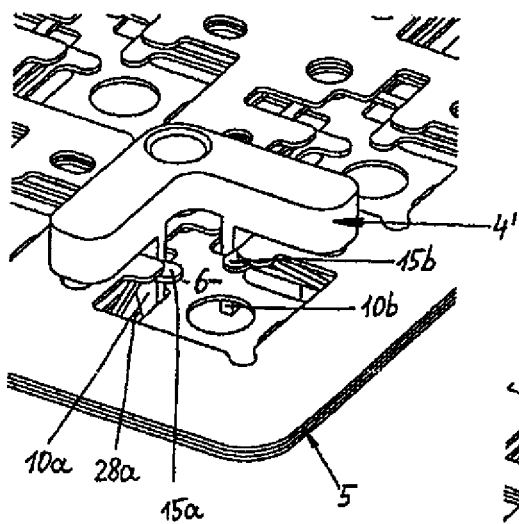

FIG. 12 shows the fully lowered position of the actuation device 4'. The actuators 10*a*, 10*b* have completely pushed through the clamping carrier 5. By means of the inclined faces 28*a*, 28*b* of the actuators 10*a*, 10*b* the spring elements 12*a*, 12*b* are pressed laterally outwards, so that the pressure sections 15*a*, 15*b* of the spring elements 12*a*, 12*b* are arranged laterally outside of the insertion region for the semiconductor components 7.

Subsequently, as can be seen from FIG. 13, the semiconductor components 7 can be inserted by means of a suitable device, for example, by means of a suction head 29, into the receiving pockets 6.

After the insertion of the semiconductor components 7, the suction heads 29 are removed from the semiconductor components 7 and the actuation device 4' is removed from the clamping carrier 5, as can be seen from FIG. 14. By reason of their spring forces the spring elements 12*a*, 12*b* press the semiconductor components 7 against the opposing stop faces 13*a*, 13*b* in the sequence already described. The semiconductor components 7 are thus aligned and fixedly clamped in the clamping carrier 5, so that they can be brought into contact with the not shown testing head. Selectively, a visual inspection or marking with a laser can also take place.

On the basis of FIGS. 16 to 19 a further example of embodiment of a clamping carrier 5' in accordance with the present teachings is described in the following This clamping carrier 5' differs from the clamping carrier 5 of FIG. 1 in that not one, but two spring plates 2, 2' are arranged one above the other, in that the stop faces 13*a*, 13*b* are arranged not on the cover plate 3', but directly on the spring plates 2, 2', and in that the cover plate 3' is designed such that it can serve to support pins 30 projecting laterally from components 7'.

Figure 16:
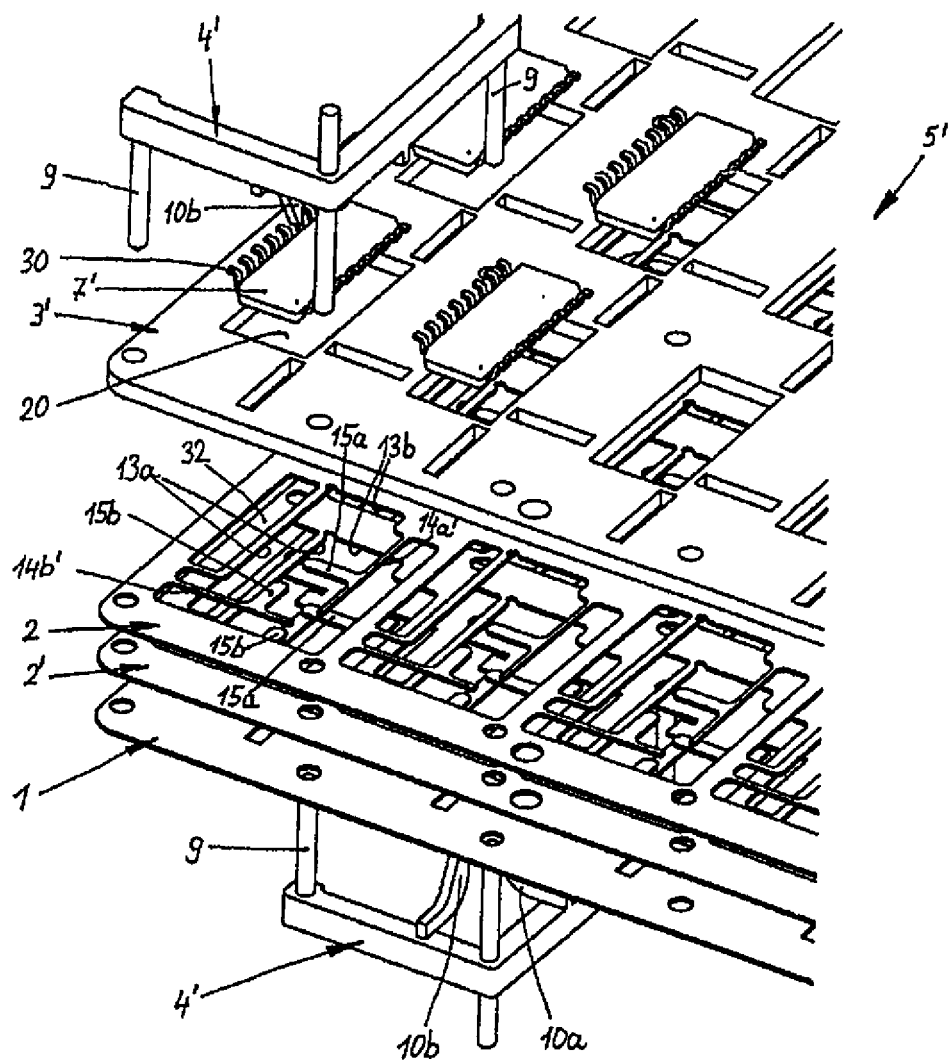
FIG. 16: An exploded view of a further embodiment of the device in accordance a representative embodiment.
Figure 19:
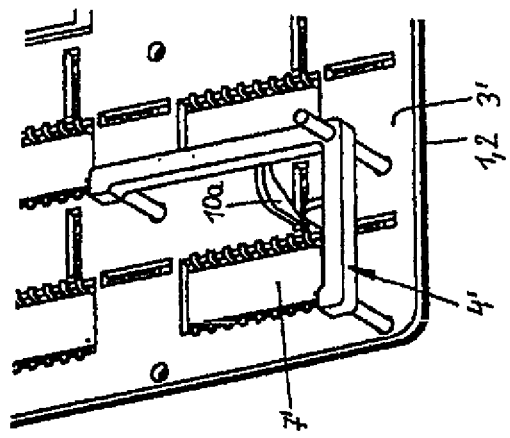
FIG. 19: A representation corresponding to FIG. 18 with a cover plate in accordance with a representative embodiment.
Figure 18:
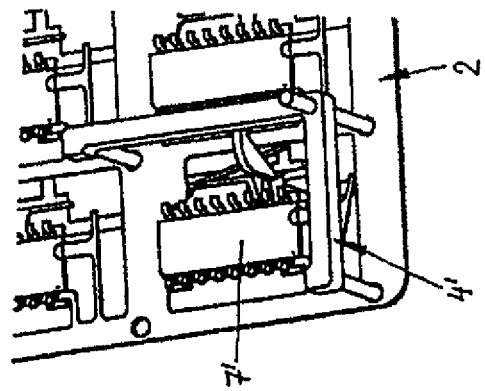
FIG. 18: A representation corresponding to FIG. 17 with semiconductor components inserted and a raised actuation device.
Figure 17:
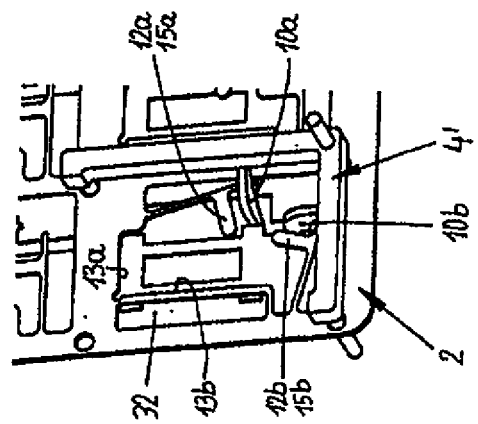
FIG. 17: An view oblique from above onto the spring plates and the base plate in FIG. 16, wherein the cover plate is omitted for the sake of clarity, and the actuation device is shown in the open position.

In this embodiment the base plate 1 can be designed to be identical or similar to the base plate 1 of FIG. 1. Without further effort it is also possible for the actuation device 4' to be designed to be identical or similar to the actuation device 4' of FIGS. 10 to 15, or also identical or similar to the actuation device 4 of FIG. 1. Furthermore it can be appropriate that the base plate 1, as represented in FIG. 16, has recesses of a type such that the actuation device 4' is introduced not only from above, but also from below, into the clamping carrier 5' so as to guide the spring elements 12*a*, 12*b* across into their open position. In this case it is possible to insert the semiconductor components 7' in an alternative manner into the receiving pockets 6 of the clamping carrier 5'. For example, it is possible to connect the clamping carrier 5', in a position turned by 180°, i.e. with the cover plate 3' downwards, with an underlying transport tray, in which the semiconductor components 7' are located. Subsequently, the clamping carrier 5' together with the transport tray can be turned by 180° so that the semiconductor components 7' can fall out of the transport tray into the receiving pockets 6 of the clamping carrier 5'.

The mode of operation of the two spring plates 2, 2' is equal to the mode of operation of the spring plate 2 of FIG. 1, so that reference is made to the remarks relating to the latter. Since two spring plates 2, 2' are arranged one above the other, it is, however, in an improved manner possible to match up the pressure sections 15*a*, 15*b* of the spring elements 12*a*, 12*b* and the opposing stop faces 13*a*, 13*b* to inclined faces of the semiconductor component body 19, as is described in more detail later on the basis of an alternative example of embodiment of FIG. 20.

Furthermore it can be seen from FIG. 16 that the spring elements 12*a*, 12*b* of the spring plates 2, 2' need not necessarily have a U-shaped spring section to be capable to apply the necessary spring force, but that a straight spring section 14*a'*, 14*b'* can suffice.

The cover plate 3', which in the embodiment of FIG. 16 is once again designed as a plane-parallel plate, consists in this case of an electrically non-conducting plastic plate. The edge regions of the cover plate 3' around the recesses 20 here serve as support faces for the pins 30. Thereby it can be avoided that the pins 30 bend back if they are pressed with a particular pressure force against contact elements of the testing head.

FIG. 20 shows a cross-section through a further example of embodiment of a clamping carrier 5". This clamping carrier 5" again has two spring plates 2, 2' lying one above the other, which can be designed in an identical or similar manner to the spring plates 2, 2' of FIG. 16. Since the spring elements 12*a* and 12*b*, lying one above the other, of the two spring plates 2, 2' respectively can move relative to one another, the pressure faces 17*a* and 17*b* can respectively match up to inclined lateral faces of the semiconductor component body 19 particularly well, as shown in FIG. 20. Furthermore the stop faces 13*a* respectively 13*b*, arranged one above the other, may be displaced laterally relative to one another and thereby be particularly well matched up to inclined faces of the semiconductor component 7'.

As can be seen from FIGS. 20 to 22, the base plate 1' in this embodiment has pin support elements 31, which extend through recesses 32 of the spring plates 2, 2' so as to form a support for the pins 30. Herein the pin support elements 31 consist of plate sections which are formed from the base plate 1' in one piece and are angled upwards at right-angles relative to the plane of the base plate. The pin support elements 31 have notches 33 into which the individual pins 30 can be inserted. Thereby the pins 30 are also fixed in a lateral direction.

FIG. 23 shows a further example of embodiment of a base plate 1". This base plate 1" is designed in a very similar manner to the base plate 1' of FIGS. 20 to 22, but has no notches 33 on the pin support elements 31, but instead a flat upper end face to support the pins 30.

Figure 24:
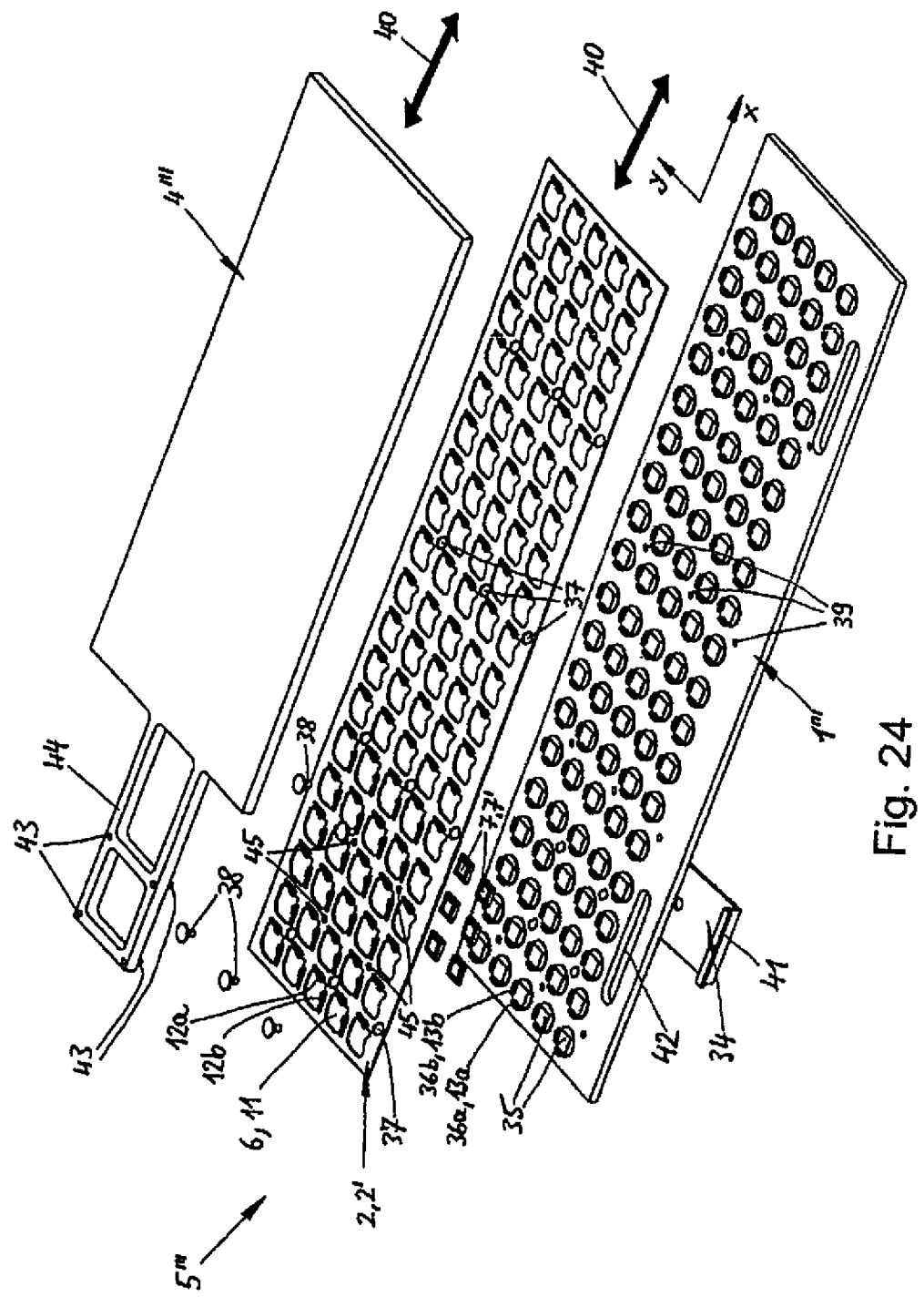
FIG. 24: A device in accordance with a representative embodiment

In FIG. 24 a further example of embodiment of the device according to the present teachings is shown schematically and in an exploded view. The clamping carrier 5''' consists in this embodiment of a base plate 1''', displaceable on the base plate 1''', a spring plate 2, 2' which can be designed to be to a large extent identical to the spring plates 2, 2' of the previous examples of embodiment, as well as an arresting device 34 to arrest the spring plate 2, 2' in a particular position relative to the base plate 1''', as is later elucidated in more detail.

The base plate 1''' has for each receiving pocket 6 a base element 35 with stop projections 36*a*, 36*b* arranged at right-angles to one another, on which are located the stop faces 13*a*, 13*b* arranged at right-angles to one another. When the spring plate 2, 2' is mounted, the stop projections 36*a*, 36*b* extend through the recesses 11 of the spring plate 2, 2'.

The spring plate 2, 2' is moveably guided on the base plate 1''', so that it can be displaced laterally, i.e. parallel to the planes of the base plate 1''' and spring plate 2, 2', respectively, in a defined manner. For this purpose the spring plate 2, 2' comprises, arranged at an inclined angle to its longitudinal axis, elongated holes 37 through which guide pins 38 can be feeded (guided). The guide pins 38 are attached with their lower end region in holes 39 of the base plate 1'''. The guide pins 38 can, for example, be cylindrical sections of rivets or screws. The elongated holes 37 of the spring plate 2, 2' are in the present example of embodiment arranged at an angle of 45° or 135° to the x-axis. The elongated holes 37 together with the guide pins 38 form a motion link guide for the spring plate 2, 2'. If the spring plate 2, 2' is moved by means of the actuation device 4''' in the direction of the arrows 40, i.e. in the direction of the x-coordinate, then the spring plate 2, 2', by reason of the motion link guide, is simultaneously displaced also in the direction of the y-coordinate. By appropriate displacement of the spring plate 2, 2' it is thus possible to move all spring elements 12a, 12b of the spring plate 2, 2' collectively out of the introduction region of the semiconductor components 7, 7', and thus to open the receiving pockets 6 so that the semiconductor components 7, 7' can be inserted into the receiving pockets 6 until they rest on the base elements 35. If the spring plate 2, 2' is subsequently displaced in the reverse direction, the spring elements 12a, 12b are advanced up to the inserted semiconductor components 7, 7' and brought into such pressure contact with the latter that they can build up an appropriate spring preload. In this position lateral holding projections 41 of the arresting device 34 are feeded through slits 42 in the base plate 1''' and applied to the side edges of the spring plate 2, 2' such that the spring plate 2, 2' is arrested in this position. The spring elements 12a, 12b, which may be designed to be identical or similar to the spring elements 12a, 12b of the previous embodiments, can therefore press the components 37 by means of their spring force in the described sequence onto the opposing stop projections 36a, 36b.

After completion of the tests, the holding projections 41 of the arresting device 34 are pulled back downwards once again, as a result of which the spring plate 2, 2' is released, so that the spring plate 2, 2' can be displaced in reversed direction by means of the actuation device 4''' and the spring elements 12a, 12b release the components 7, 7'.

Thus for this embodiment the method comprises the following steps:
  opening of the receiving pockets by displacement of the spring plate 2, 2',
  loading of the receiving pockets 6 with the semiconductor components 7, 7',
  advancement of the spring elements 12a, 12b up to the semiconductor components 7, 7' and pre-loading by displacement of the spring plate 2, 2' in the reversed direction,
  locking of the position of the spring plate 2, 2' by means of the arresting device 34.

In order to displace the spring plate 2, 2' laterally, the actuation device 4''' is releasably coupleable with the spring plate 2, 2'. The actuation device 4''' is just schematically shown in FIG. 24 and may, for example, have actuation pins 43, which project downwards beyond a frame section 44 and can be brought into and out of engagement with holes (bores) 45 in the spring plate 2, 2' if the actuation device 4''' is moved in a vertical direction. To insert and remove the components 7, 7' into and out of the receiving pockets 6 respectively, the actuation device 4''' is removed such that the insertion and removal of the semiconductor components 7, 7' is possible without any hindrance.

As an alternative to the example of embodiment shown it is also possible to design the elongated holes 37 not in an inclined straight manner, but in a curved shape. Furthermore elongated holes 37 are also conceivable that have an elongated hole section extending in the x-direction and an elongated hole section extending in the y-direction, wherein the actuation device 4' is then moved both in the direction of the x-coordinate and also in the direction of the y-coordinate.

Figure 25:
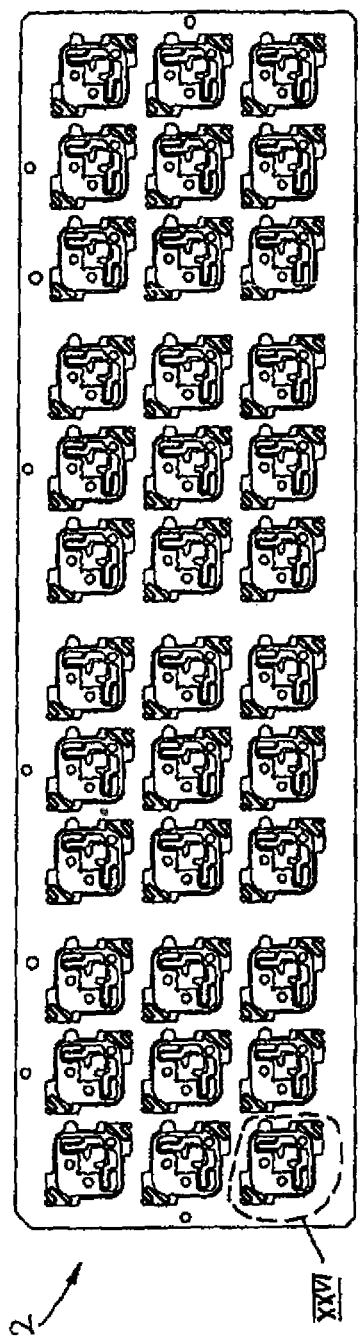
FIG. 25: A plan view onto a further embodiment of a spring plate in accordance with a representative embodiment
Figure 26:
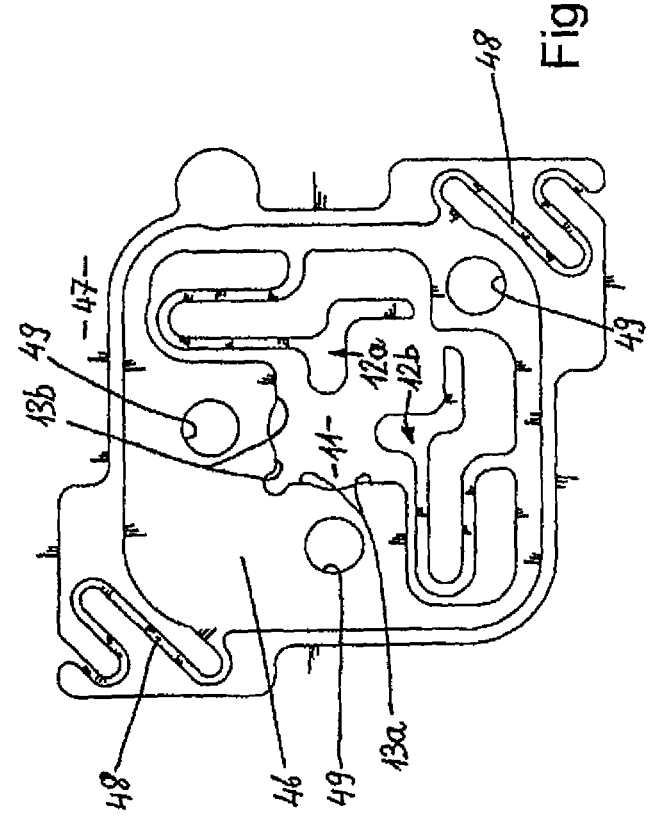
FIG. 26: The detail XXVI in FIG. 25 in an enlarged representation.

FIG. 25 shows a plan view onto a further embodiment of a spring plate 2, which together with a base plate and/or cover plate, as they have been described in conjunction with previous examples of embodiment, can be combined into a multi-layered plate combination. This spring plate 2 has in turn a plurality of recesses 11, in which singulated semiconductor components 7, 7' can be inserted and held by means of spring elements 12a, 12b. As can be seen from FIGS. 25, 26, the spring elements 12a, 12b there are designed and arranged in an identical or very similar manner to those that are represented in FIGS. 6 and 7. With reference to the design and mode of operation of the spring elements 12a, 12b reference is thus made to the corresponding description of the first embodiment. It is, however, also possible without further effort that the spring elements 12a, 12b do not have different spring forces, but equal spring forces.

In this embodiment the stop faces 13a, 13b, against which the inserted semiconductor components are pressed by means of the spring elements 12a, 12b, are located directly on the spring plate 2. Both these stop faces 13a, 13b and also the spring elements 12a, 12b are part of a spring plate section 46, which is largely separated from the surrounding spring plate body 47 and is connected to the latter in a resilient (springy) manner by means of suspension springs 48 only. In the present case two suspension springs 48 are provided, which are arranged in the diagonally opposed corner regions of each spring plate section 46. The spring plate sections 46 are thus supported in the spring plate body 47 in a floating manner, wherein they can be displaced towards all sides relative to the spring plate body 46. Furthermore in the example of embodiment shown, each spring plate section 46 has centering means in the form of three centering holes 49. Thereby it is possible to centre each spring plate section 46 and the therein accommodated semiconductor components in a simple manner, if the clamping carrier equipped with the spring plate 2, after it has been loaded with the semiconductor components, is traversed against a contact device, for example against a contact socket or a DUT board, wherein on these contact devices, corresponding centering bolts are then provided which engage in the centering holes 49.

Figure 27:
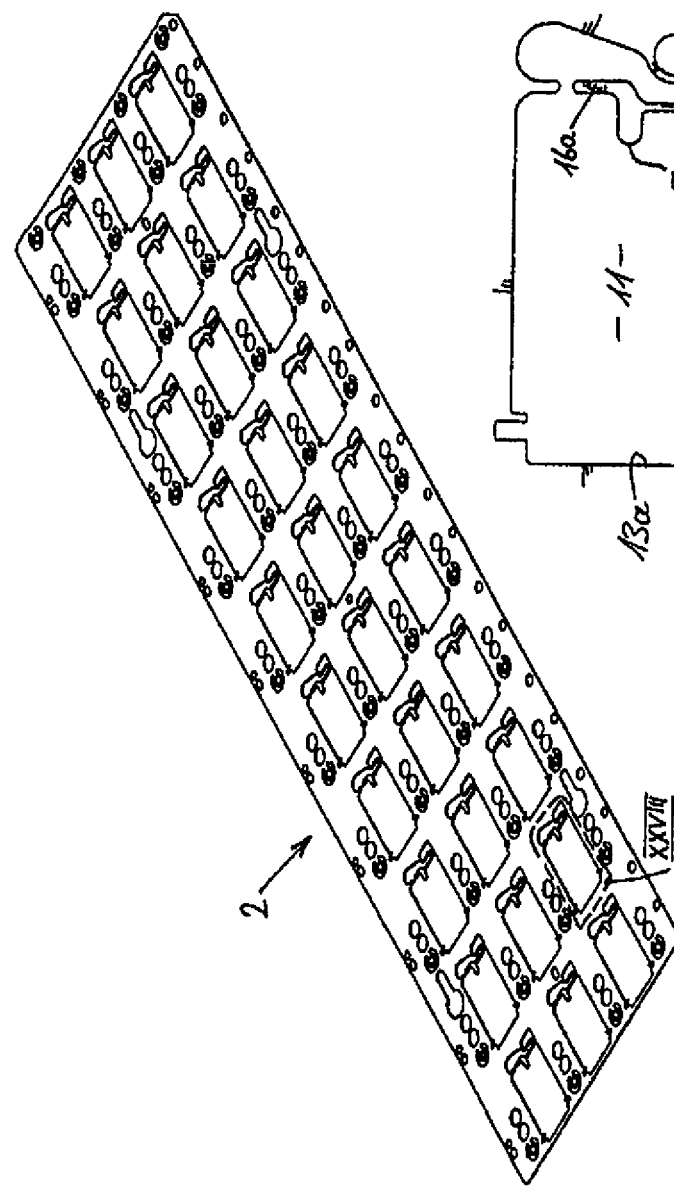
FIG. 27: A plan view obliquely from above onto a representative embodiment of a spring plate in accordance with the invention.

FIG. 27 shows a further example of embodiment of a spring plate 2, which once again in combination with a base plate and/or cover plate, in accordance with one of the previous examples of embodiment, can result in a multi-layer plate combination. Also this spring plate 2 is once again designed as a plane-parallel, flat plate and has a large number of recesses 11, in which singulated semiconductor components can be inserted. A significant difference to the previous embodiments is that in the case of this spring plate 2, as can in particular be seen from FIG. 28, just a single spring element 12a is provided per receiving pocket. This spring element 12a can again be designed in an identical or very similar manner to the spring element 12a shown in FIGS. 6 and 7, so that reference is made back to the description at that point. The stop face 13a, against which the semiconductor component is pressed, is located on the side of the recess 11 opposite to the spring element 12. As an alternative hereto, it is also possible without further effort to provide the stop face 13a on the cover plate or the base plate, which are adjacent to the spring plate 2 on both sides.

Figure 29:
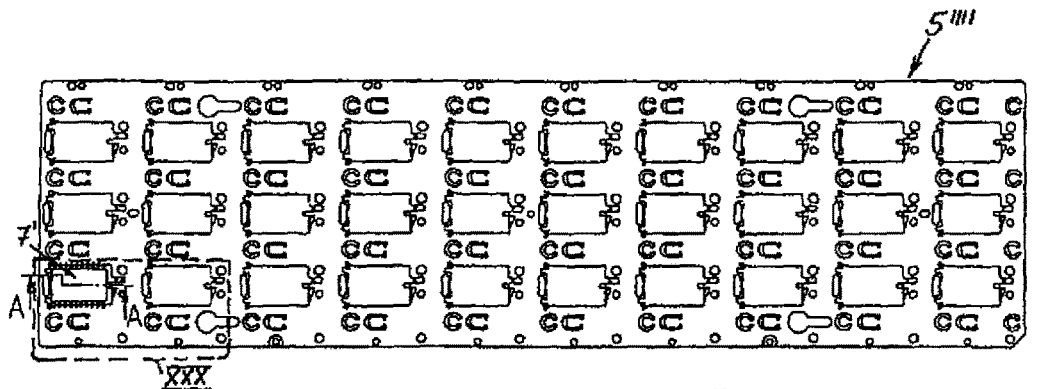
FIG. 29: A plan view onto a clamping carrier in accordance with a representative embodiment.
Figure 30:
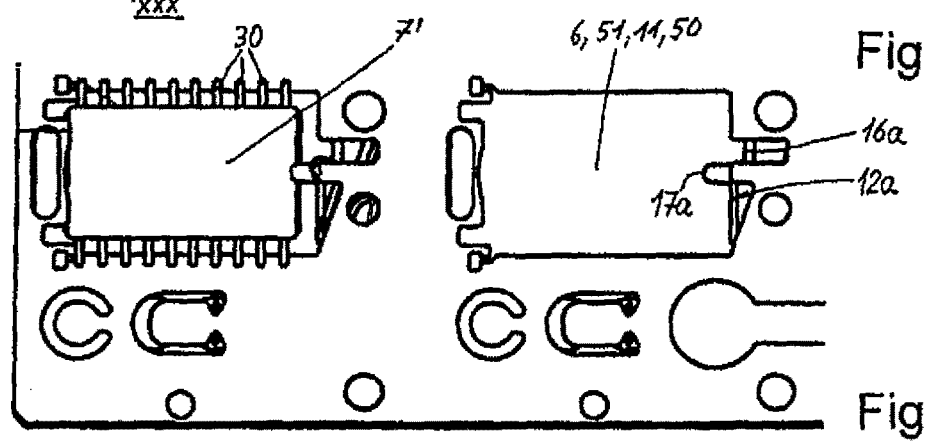
FIG. 30: The detail XXX in FIG. 29 in an enlarged representation.

FIG. 29 shows a plan view onto a further example of embodiment of a clamping carrier 5'''. As can be seen from FIGS. 31, 32, this clamping carrier 5''' consists of a three-layer plate combination with a base plate 1, a spring plate 2 and a cover plate 3. All three plates are again designed as plane-parallel, flat, thin plates, which appropriately have the same length and width dimensions.

Figure 31:
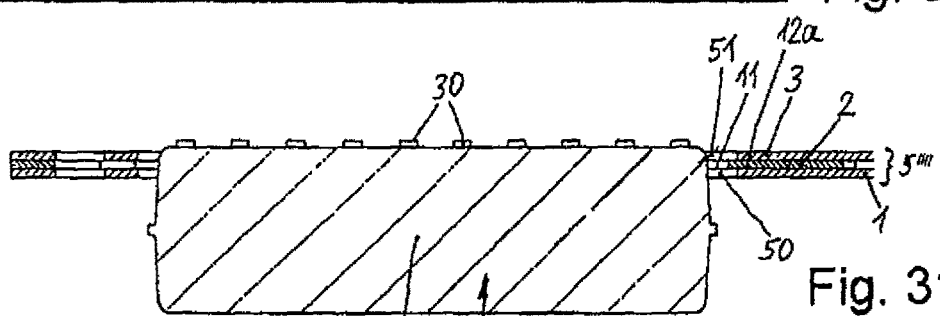
FIG. 31: A longitudinal section along the line A-A in FIG. 29, wherein the spring element and the semiconductor component are in the insertion position.
Figure 32:
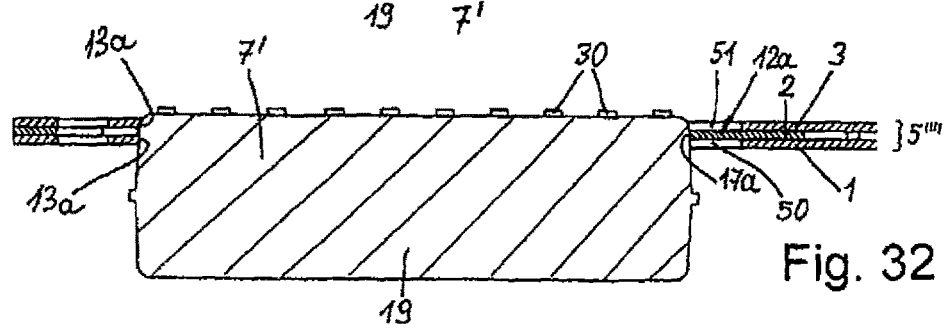
FIG. 32: A representation corresponding to FIG. 31, wherein the semiconductor component is pressed into the centered holding position by the spring element.

In contrast to the base plate 1 of the first embodiment the base plate 1 shown in FIGS. 31, 32 does not serve to form the bottom for the individual receiving pockets, on which the semiconductor components sit. Instead the base plate 1 in the region of each receiving pocket has a recess 50, which is arranged underneath the assigned recess 11 of the spring plate 2. The cover plate 3, which can be seen from above in FIG. 29, has a recess 51, which is arranged above the recess 11 of the spring plate 2. Furthermore the recesses 50, 51 are dimensioned such that the body 19 of a semiconductor component 7' can be guided through without striking against the lateral edges of the recesses.

Figure 28:
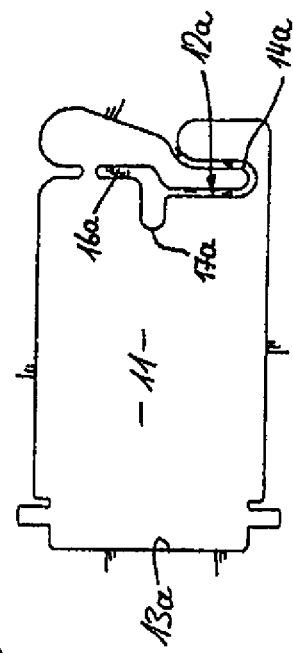
FIG. 28: The detail XXVIII in FIG. 27 in an enlarged representation.

The spring plate 2 is designed in an identical or similar manner, as shown in FIGS. 27, 28.

FIG. 31 shows the plate combination in the region of a receiving pocket in a state in which the spring element 12a by means of a suitable actuation device, for example by means of the actuation device 4, 4', has been moved laterally outwards, that is to say, to the right in FIG. 31, so that a sufficiently large lateral free space is created, through which the body 19 of the semiconductor component 7' can be guided from above through the recesses 51, 11, 50 until the pins 30 of the semiconductor component 7' rest on the upper face of the cover plate 3. If subsequently the actuation device is released from the spring elements 12a, these press, by reason of their pre-load force, laterally against the body 19 of the semiconductor component 7' and displace the latter, as can be seen from FIG. 32, to the left against the stop faces 13a, which in the present case are located both on the base plate 1 and also on the cover plate 3.

In this embodiment it is not necessary to provide special pin support elements. Instead it is sufficient if the surface of the cover plate 3 consists of a non-conducting material, at least at those locations at which the pins 30 rest on the cover plate 3. Also the cover plate 3, as any other plate, can consist of a spring steel sheet, coated with a non-conducting material.

Within the framework of the present teachings numerous variations are possible. In particular it is possible to combine the various base plates, spring plates and cover plates of the above-described various embodiments with each other in a widest variety of manners so as to create a clamping carrier for a large number of singulated semiconductor components that is optimally designed for the particular application. Although it will be advantageous in many cases to create a three-layer plate combination with a base plate, spring plate and cover plate, it is also conceivable to create just a two-layer plate combination, or a plate combination that consists of more than three plates. It is also possible that the clamping carrier has only the spring plate, and is therefore embodied as a single layer. The receiving pockets are then formed only from the assigned recesses of the spring plate. Furthermore the individual plates need not necessarily have the same width and length dimensions, although this is advantageous. It is also possible, to sub-divide individual plates and to arrange the pieces side-by-side if, for example, production can be simplified in this way.

One of ordinary skill in the art appreciates that many variations are possible that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A device to align and hold a plurality of singulated semiconductor components with a clamping carrier in the form of a plate, the clamping carrier comprising:
   a plurality of receiving pockets arranged side-by-side, into which the semiconductor components are insertable;
   stop elements for accurate positioning of the semiconductor components within the receiving pockets; and
   spring elements for pressing the semiconductor components against the stop elements by means of spring force,
   wherein the spring elements are part of a spring plate,
   wherein the spring plate comprises:
   a plurality of recesses arranged side-by-side and providing the corresponding plurality of receiving pockets for the semiconductor components, wherein the spring elements are formed monolithically from the spring plate in one piece, and
   wherein the clamping carrier further comprises a multi-layer plate composite that comprises the spring plate, a base plate, or a cover plate both adjacent to the spring plate, wherein the spring plate extends at least over a major part of the base plate or the cover plate, and wherein the spring plate, the base plate or the cover plate are fastened to each other, and
   wherein the spring plate consists of a flat plate.

2. The device according to claim 1, wherein the spring elements consist of spring tongues that are arranged and can be moved in a plane of the spring plate, or parallel to the plane.

3. The device according to claim 1, wherein the base plate is a flat plate that forms a bottom of the receiving pockets.

4. A device according to claim 1, wherein the base plate has, arranged in the region of the receiving pockets, recesses for the introduction of the semiconductor components, wherein these recesses and the recesses of the spring plate overlay each other.

5. The device according to claim 1, wherein the stop elements for accurate positioning of the semiconductor components are arranged on the cover plate or spring plate.

6. The device according to claim 1, wherein the cover plate consists of a plane plate extending over at least the major part of the spring plate, and has recesses that are arranged above the recesses of the spring plate.

7. The device according to claim 1, wherein the clamping carrier is designed for the accommodation of semiconductor components having pins, wherein the base plate has pin support elements, which extend through the recesses of the spring plate so as to form a support for the pins.

8. The device according to claim 1, wherein the stop elements and the spring elements are part of a spring plate section.

9. The device according to claim 1, wherein the multi-layer plate composite comprises individual plates.

10. The device according to claim 1, wherein each of the plurality of recesses is formed by all layers of the multi-layer plate composite.

11. A device to align and hold a plurality of singulated semiconductor components with a clamping carrier in the form of a plate, the clamping carrier comprising:
   a plurality of receiving pockets arranged side-by-side, into which the semiconductor components are insertable;

stop elements for accurate positioning of the semiconductor components within the receiving pockets; and spring elements for pressing the semiconductor components against the stop elements by means of spring force, wherein the spring elements are part of a spring plate, wherein the spring plate comprises:

a plurality of recesses arranged side-by-side and providing the corresponding plurality of receiving pockets for the semiconductor components, wherein the spring elements are formed from the spring plate in one piece, wherein the clamping carrier further comprises a multi-layer plate composite that comprises the spring plate and a base plate, or a cover plate, or both adjacent to the spring plate, wherein the spring plate extends at least over a major part of the base plate or the cover plate, wherein the stop elements and the spring elements are part of a spring plate section, and wherein the spring plate section is separated from a spring plate body.

12. The device according to claim 11, wherein the spring plate section is connected to the spring plate body by means of suspension springs.

13. The device according to claim 12, wherein two suspension springs are provided which are arranged in diagonally opposed corner regions of each spring plate section.

14. The device according to claim 11, wherein each spring plate section comprises centering elements.

* * * * *